(12) United States Patent
Fujikawa et al.

(10) Patent No.: US 10,960,435 B2
(45) Date of Patent: Mar. 30, 2021

(54) FILM FORMING APPARATUS, FILM FORMING METHOD, AND STORAGE MEDIUM

(71) Applicant: TOKYO ELECTRON LIMITED, Tokyo (JP)

(72) Inventors: Makoto Fujikawa, Nirasaki (JP); Reiji Niino, Nirasaki (JP); Hiroyuki Hashimoto, Nirasaki (JP); Tatsuya Yamaguchi, Nirasaki (JP); Syuji Nozawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 146 days.

(21) Appl. No.: 15/915,392

(22) Filed: Mar. 8, 2018

(65) Prior Publication Data
US 2018/0264516 A1    Sep. 20, 2018

(30) Foreign Application Priority Data

Mar. 16, 2017 (JP) .............................. JP2017-051552

(51) Int. Cl.
*C23C 16/455* (2006.01)
*B05D 1/00* (2006.01)
(Continued)

(52) U.S. Cl.
CPC ............... *B05D 1/60* (2013.01); *B05D 1/002* (2013.01); *C23C 16/4411* (2013.01);
(Continued)

(58) Field of Classification Search
None
See application file for complete search history.

(56) References Cited

U.S. PATENT DOCUMENTS

2006/0159847 A1* 7/2006 Porter .................. C23C 16/345
427/248.1
2012/0199067 A1* 8/2012 Morozumi ........ H01L 21/67109
118/719
(Continued)

FOREIGN PATENT DOCUMENTS

JP    H6-77474 A    3/1994
JP    5966618 B2    7/2016

*Primary Examiner* — David P Turocy
(74) *Attorney, Agent, or Firm* — Nath, Goldberg & Meyer; Jerald L. Meyer

(57) ABSTRACT

A film forming apparatus includes: a film forming gas discharge part; an exhaust port; a rotation mechanism; a heating part configured to heat the interior of a reaction container to a temperature lower than a temperature of a film forming gas discharged from the film forming gas discharge part; first gas discharge holes opened, in the film forming gas discharge part, toward a gas temperature reducing member so that the film forming gas is cooled by colliding with the gas temperature reducing member inside the reaction container before the film forming gas is supplied to substrates; and second gas discharge holes opened, in the film forming gas discharge part, in a direction differing from an opening direction of the first gas discharge holes so that the film forming gas does not collide with the gas temperature reducing member before the film forming gas is supplied to the substrates.

7 Claims, 14 Drawing Sheets

(51) Int. Cl.
*H01L 21/02* (2006.01)
*C23C 16/44* (2006.01)
*H01L 21/67* (2006.01)

(52) U.S. Cl.
CPC .. *C23C 16/45523* (2013.01); *C23C 16/45574* (2013.01); *C23C 16/45578* (2013.01); *C23C 16/45591* (2013.01); *C23C 16/45597* (2013.01); *H01L 21/02118* (2013.01); *H01L 21/02271* (2013.01); *H01L 21/67017* (2013.01); *H01L 21/67109* (2013.01)

(56) References Cited

U.S. PATENT DOCUMENTS

| | | | | |
|---|---|---|---|---|
| 2013/0316080 | A1* | 11/2013 | Yamaguchi | H01L 21/76898 |
| | | | | 427/255.6 |
| 2014/0357058 | A1* | 12/2014 | Takagi | H01L 21/0262 |
| | | | | 438/478 |
| 2016/0284533 | A1* | 9/2016 | Nagano | H01L 21/0228 |
| 2017/0100742 | A1* | 4/2017 | Pore | C23C 16/45525 |

* cited by examiner

FILM FORMING APPARATUS, FILM FORMING METHOD, AND STORAGE MEDIUM

CROSS-REFERENCE TO RELATED APPLICATION

This application is based upon and claims the benefit of priority from Japanese Patent Application No. 2017-051552, filed on Mar. 16, 2017, the entire contents of which are incorporated herein by reference.

TECHNICAL FIELD

The present disclosure relates to a technique for performing a film forming process on a plurality of substrates held in a shelf shape in a vertical reaction container.

BACKGROUND

In a manufacturing process of a semiconductor device, a film forming process is performed in a vacuum atmosphere on a semiconductor wafer (hereinafter referred to as "wafer"), which is a substrate. A film forming apparatus for performing such a process is provided with a vertical reaction container in which a substrate holder holding a plurality of wafers in a shelf configuration is loaded and the interior thereof is heated. A film forming gas may be supplied from a gas injector arranged on one end of the wafers toward the rotating wafers, and a gas may be exhausted from an exhaust port arranged at an opposite end of the wafers. A film forming apparatus having such a configuration is known in related arts. Furthermore, a configuration in which a gas is discharged from a gas injector toward wafers in two different directions is also known in related arts.

Studies have been done on forming a polymer film on a wafer by vapor deposition polymerization (VDP) using the above-mentioned film forming apparatus. The VDP is a method in which different kinds of monomers serving as film formation raw materials are vaporized and supplied to a substrate in a vacuum atmosphere and the respective monomers are subjected to polymerization reaction on the surface of the substrate to form a film. When performing the VDP, studies were made on maintaining a temperature capable of preventing the condensation and solidification of the monomers in a gas flow path extending from a vaporization part for vaporizing the monomers to the gas inductor, and a temperature inside a reaction container, i.e., a temperature of a wafer, is set lower than the temperature of the gas flow in order to increase the adsorption efficiency of the monomers and to achieve a high film forming efficiency as described below in the detailed description. However, the present inventors have found that when the temperatures of the respective parts are set in this manner, a difference in film thickness occurs between the central portion and the peripheral edge portion of the wafer because a difference in the temperature of the gas supplied to the respective portions in the plane of the wafer is generated as will be described later.

SUMMARY

Some embodiments of the present disclosure provide a technique capable of controlling the film thickness in a central portion of each substrate and the film thickness in a peripheral edge portion of each substrate, respectively, when performing a film forming process on a plurality of substrates held in a shelf configuration inside a vertical reaction container.

According to one embodiment of the present disclosure, there is provided a film forming apparatus for forming a film by supplying a film forming gas to a plurality of substrates held in a shelf configuration by a substrate holder in a vertical reaction container in which a vacuum atmosphere is formed. The apparatus includes: a film forming gas discharge part provided on a rear side of a substrate holding region inside the reaction container and configured to discharge the film forming gas; an exhaust port provided on a front side of the substrate holding region and configured to exhaust the film forming gas; a rotation mechanism configured to rotate the substrate holder about a vertical axis; a heating part configured to heat the interior of the reaction container to a temperature lower than a temperature of the film forming gas discharged from the film forming gas discharge part; first gas discharge holes opened, in the film forming gas discharge part, toward a gas temperature reducing member in a lateral direction, so that the film forming gas is cooled by colliding with the gas temperature reducing member inside the reaction container before the film forming gas is supplied to the substrates; and second gas discharge holes opened, in the film forming gas discharge part, in a direction differing from an opening direction of the first gas discharge holes, so that the film forming gas does not collide with the gas temperature reducing member before the film forming gas is supplied to the substrates.

According to another embodiment of the present disclosure, there is provided a film forming method for forming a film by supplying a film forming gas to a plurality of substrates held in a shelf configuration by a substrate holder in a vertical reaction container in which a vacuum atmosphere is formed. The method includes: discharging the film forming gas from a film forming gas discharge part provided on a rear side of a substrate holding region inside the reaction container; exhausting the film forming gas from an exhaust port provided on a front side of the substrate holding region; rotating the substrate holder about a vertical axis by a rotation mechanism; heating the interior of the reaction container by a heating part to a temperature lower than a temperature of the film forming gas discharged from the film forming gas discharge part; discharging the film forming gas from first gas discharge holes opened, in the film forming gas discharge part, toward a gas temperature reducing member inside the reaction container in a lateral direction, so that the film forming gas is cooled by colliding with the gas temperature reducing member before the film forming gas is supplied to the substrates; and discharging the film forming gas from second gas discharge holes opened, in the film forming gas discharge part, in a direction differing from an opening direction of the first gas discharge holes, so that the film forming gas does not collide with the gas temperature reducing member before the film forming gas is supplied to the substrates.

According to another embodiment of the present disclosure, there is provided a non-transitory computer-readable storage medium storing a computer program used in a film forming apparatus for forming a film by supplying a film forming gas to a plurality of heated substrates held in a shelf configuration by a substrate holder in a vertical reaction container in which a vacuum atmosphere is formed. The computer program incorporates a step group so as to execute the film forming method of the present disclosure.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The film forming apparatus 1 as one embodiment of the present disclosure will be described with reference to FIG. 1 which is a vertical sectional side view and FIG. 2 which is a horizontal sectional plan view. The film forming apparatus 1 is configured to form a polyimide film, which is a polymer film, by supplying a film forming gas containing two kinds of monomers to a wafer W and performing the VDP described in the background section. The film forming apparatus 1 includes a reaction container 11 configured to accommodate therein a wafer boat 21, which is a substrate holder for holding a number of wafers W, and configured to perform a film forming process for the respective wafers W at a time.

Figure 1:
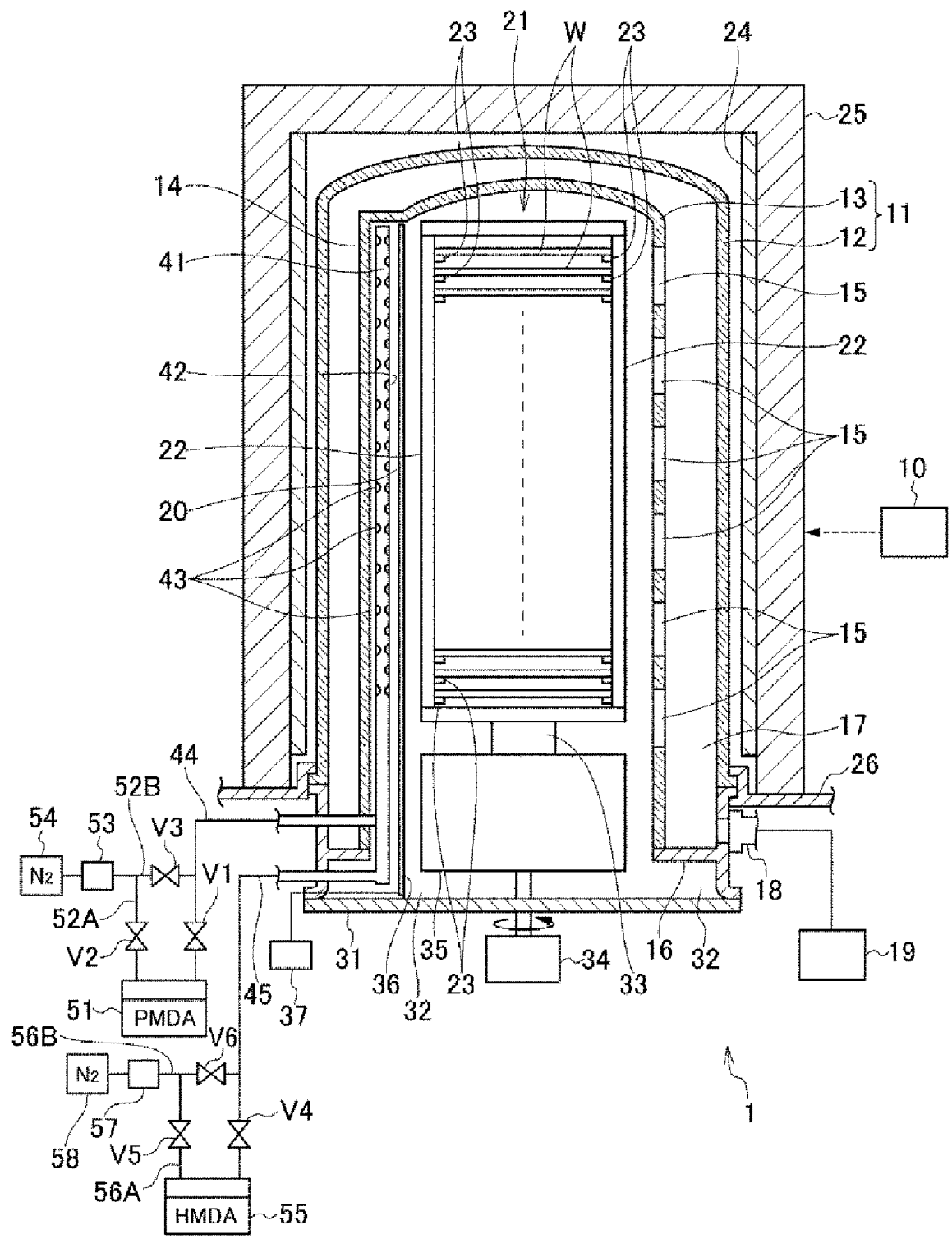
FIG. 1 is a vertical sectional side view of a film forming apparatus according to an embodiment of the present disclosure.

In the figures, reference numeral 22 denotes three vertical support columns (only two of which are shown in FIG. 1) constituting the wafer boat 21. In the figures, reference numeral 23 denotes wafer mounting portions protruding from the respective support columns 22. The mounting portions 23 are provided in multiple stages in the vertical direction. By being horizontally mounted on the respective mounting portions 23, a plurality of wafers W is held in a shelf shape so that the lateral positions thereof are aligned with each other. Accordingly, the upper side of each of the mounting portions 23 forms a substrate holding region. As shown in FIG. 1, on the outer side of the reaction container 11, there is provided a heating furnace main body 25, on the inner wall surface of which a heater 24 as a heating part is disposed. Reference numeral 26 in FIG. 1 denotes a support part for supporting the reaction container 11 and the heating furnace main body 25 from the lower side.

The reaction container 11 has a double tube structure composed of an outer tube 12 and an inner tube 13 accommodated inside the outer tube 12. The outer tube 12 and the inner tube 13 are formed in a vertical type reaction container having a ceiling. When seen in a horizontal cross section, the outer tube 12 and the inner tube 13 are formed in a circular shape. The interior of the inner tube 13 is formed as a film forming chamber in which a film forming process is performed. A part of the side wall of the inner tube 13 bulges toward the outside to form a convex portion 14 extending in the vertical direction (up-down direction). The space inside the convex portion 14 forms a diffusion region 20 in which a gas discharged from rear gas discharge holes 43 described later diffuses.

In the diffusion region 20, a gas injector 41, which is a vertical rod-like gas discharge part, is formed so as to extend along the length direction of the inner tube 13. On the side wall of the inner tube 13, a plurality of slit-shaped exhaust ports 15 extending in the length direction of the inner tube is formed in a vertically spaced-apart relationship. The gas injector 41 and the exhaust ports 15 are opposite each other across the wafer boat 21. A gas is exhausted from the exhaust ports 15 in parallel with the discharge of a film forming gas from front gas discharge holes 42 provided in the gas injector 41 described later. Film formation is performed in a state in which a gas flow moving from the side of the gas injector 41 toward the exhaust ports 15 is formed inside the inner tube 13. In the following description, it is assumed that the side on which the gas injector 41 is provided is the rear side, and the side on which the exhaust ports 15 are provided is the front side. By providing the diffusion region 20, a distance L2 from the rear end of the wafer W to the side surface of the inner tube 13 is larger than a distance L1 from the front end of the wafer W to the side surface of the inner tube 13 (see FIG. 2).

In FIG. 1, reference numeral 16 denotes a substantially cylindrical flange portion for supporting the outer tube 12 and the inner tube 13 from the lower side and for hermetically closing the ring-shaped region between the lower end surface of the outer tube 12 and the lower end surface of the inner tube 13. The upstream end of an exhaust pipe 18 is connected to the rear side wall of the flange portion 16 so as to be opened to a ventilation region 17 between the outer tube 12 and the inner tube 13. However, in FIG. 1, for the sake of avoiding the complexity of illustration 1, the upstream end of the exhaust pipe 18 is shown as being connected to the front side wall of the flange portion 16. The downstream end of the exhaust pipe 18 is connected to a vacuum pump 19 via a pressure regulation part (not shown) such as a butterfly valve or the like. The vacuum pump 19 may perform exhaust from the exhaust ports 15 via the ventilation region 17 and may set the inside of the reaction container 11 to a vacuum atmosphere of a desired pressure.

In FIG. 1, reference numeral 31 denotes a lid that keeps the inside of the reaction container 11 airtight by closing an opening 32 provided at the lower end of the flange portion 16. In FIG. 1, reference numeral 33 denotes a support portion for the wafer boat 21 provided on the lid 31. In FIG. 1, reference numeral 34 denotes a rotation mechanism that rotates the support portion 33. In order to make the film thickness in the circumferential direction of the wafer W uniform, the rotation mechanism 34 rotates the wafer boat 21 about a center axis of the wafer W, which is a vertical axis, via the support portion 33 during a film forming process. In this embodiment, the film thickness distribution in the radial direction of the wafer W is also made uniform to increase the uniformity of the film thickness in the entire plane of the wafer W. In FIG. 1, reference numeral 35 denotes a heat insulating member interposed between the lid 31 and the support portion 33. The lid 31 is raised and lowered by an elevating mechanism (not shown) to load and unload the wafer boat 21 into and from the inner tube 13 and to open and close the opening 32.

Next, the gas injector 41 will be described in more detail with reference to the perspective view of FIG. 3. Inside the gas injector 41, a gas flow path is formed along the length direction thereof. In the side wall of the gas injector 41, a plurality of gas discharge holes (second gas discharge holes) 42 and a plurality of gas discharge holes (first gas discharge holes) 43, which are connected to the gas flow path, are opened in the horizontal direction toward the front side and the rear side, respectively. The gas discharge holes 42 are referred to as front gas discharge holes 42. The front gas discharge holes 42 are formed at positions corresponding to the heights of the respective wafers W so that a gas can be supplied to the surfaces of the wafers W mounted on the wafer boat 21 along the diameter of the wafers W. The front gas discharge holes 42 are perforated so as to form a row in the vertical direction in a spaced-apart relationship with each other. As shown in FIG. 2, when seen in a plan view, the exhaust ports 15 are located in the opening direction of the front gas discharge holes 42.

The gas discharge holes 43 are referred to as rear gas discharge holes 43. The rear gas discharge holes 43 are also perforated so as to form a row in the vertical direction. In this example, the rear gas discharge holes 43 are located at the same heights as every other front gas discharge holes 42. The number of the rear gas discharge holes 43 is one half of the number of the front gas discharge holes 42. In addition, the angle between the opening direction of the rear gas discharge holes 43 and the opening direction of the front gas discharge holes 42 is 180 degrees. The diameter of the front gas discharge holes 42 and the diameter of the rear gas discharge holes 43 are equal to each other. Accordingly, in the gas injector 41, the opening ratio of the front side and the opening ratio of the rear side are different from each other. In other words, the sum of the areas of the front gas discharge holes 42 when the gas injector 41 is viewed from the front side is different from the sum of the areas of the rear gas discharge holes 43 when the gas injector 41 is viewed from the rear side.

As shown in FIG. 1, one ends of gas introduction pipes 44 and 45 are connected to the lower portion of the gas injector 41 below the region where the front gas discharge holes 42 and the rear gas discharge holes 43 are formed. The gas injector 41 is configured such that the gases supplied from the gas introduction pipes 44 and 45 are mixed in the gas injector 41 and are discharged from the front gas discharge holes 42 and the rear gas discharge holes 43. The other ends of the gas introduction pipes 44 and 45 pass through the side wall of the flange portion 16 and extend outside of the flange portion 16.

The other end of the gas introduction pipe 44 is connected to the vaporization part 51 via a valve V1. In the vaporization part 51, PMDA ($C_{10}H_2O_6$: pyromellitic dianhydride), which is a monomer as a raw material for forming a polyimide film, is stored in, for example, a solid state. The vaporization part 51 is provided with a heater (not shown) for heating the PMDA. One end of a gas supply pipe 52A is connected to the vaporization part 51, and the other end of the gas supply pipe 52A is connected to an $N_2$ (nitrogen) gas supply source 54 through a valve V2 and a gas heating part 53 in the named order. With this configuration, the heated $N_2$ gas is supplied to the vaporization part 51 to vaporize the PMDA existing in the vaporization part 51. A mixed gas of the $N_2$ gas used for the vaporization and the PMDA gas may be used as a film forming gas and may be introduced into the gas injector 41 through the gas introduction pipe 44.

At the downstream side of the gas heating part 53, the gas supply pipe 52A is branched to form a gas supply pipe 52B. The other end of the gas supply pipe 52B is connected to the gas introduction pipe 44 at the downstream side of the valve V1 via a valve V3. With this configuration, when the film forming gas containing the PMDA is not supplied to the gas injector 41, the $N_2$ gas heated by the gas heating part 53 may be allowed to bypass the vaporization part 51 and may be introduced into the gas injector 41.

The other end of the gas introduction pipe 45 is connected to a vaporization part 55 via a valve V4. In the vaporization part 55, hexamethylenediamine (HMDA), which is a monomer as a raw material for forming a polyimide film, is stored in, for example, a solid state. The vaporization part 55 is provided with a heater (not shown) for heating the HMDA. One end of a gas supply pipe 56A is connected to the vaporization part 55. The other end of the gas supply pipe 56A is connected to an $N_2$ gas supply source 58 via a valve V5 and a gas heating part 57. With this configuration, the heated $N_2$ gas is supplied to the vaporization part 55 to vaporize the HMDA existing in the vaporization part 55. A mixed gas of the $N_2$ gas used for the vaporization and the HMDA gas may be used as a film forming gas and may be introduced into the gas injector 41 through the gas introduction pipe 45.

At the downstream side of the gas heating part 57, the gas supply pipe 56A is branched to form a gas supply pipe 56B. The other end of the gas supply pipe 56B is connected to the gas introduction pipe 45 at the downstream side of the valve V4 via a valve V6. With this configuration, when the film forming gas containing the HMDA is not supplied to the gas injector 41, the $N_2$ gas heated by the gas heating part 57 may be allowed to bypass the vaporization part 55 and may be introduced into the gas injector 41.

Hereinafter, the $N_2$ gas not containing a monomer will be simply referred to as an $N_2$ gas to distinguish it from the film forming gas which is an $N_2$ gas containing a monomer. In the gas introduction pipe 44 or 45, for example, a heater for heating the inside of the pipe is provided around the pipe in order to prevent condensation and solidification of the PMDA or the HMDA contained in the film forming gas flowing through the pipe. Rod-like nozzle heaters 36 extending along the vertical direction are provided on the left and right of the gas injector 41 inside the inner tube 13. The inside of the gas injector 41 may be heated by the nozzle heaters 36 to prevent condensation and solidification of the PMDA or the HMDA existing in the gas injector 41. In FIG. 1, for the sake of avoiding the complexity of illustration, the nozzle heaters 36 are shown as if they are displaced toward the front side. Reference numeral 37 in FIG. 1 denotes a power supply part that supplies electric power to the nozzle heaters 36.

The film forming apparatus 1 is provided with a control part 10 composed of a computer. A program (not shown) is stored in the control part 10. The program incorporates a step group such that a control signal is output from the control part 10 to each part of the film forming apparatus 1 to control the operation of each part to perform a film formation process described below. The program is stored in a storage medium such as a hard disk, a compact disk, a magneto-optical disk, a memory card or the like. In this state, the program is installed in the control part 10 and is operated.

Figure 4:
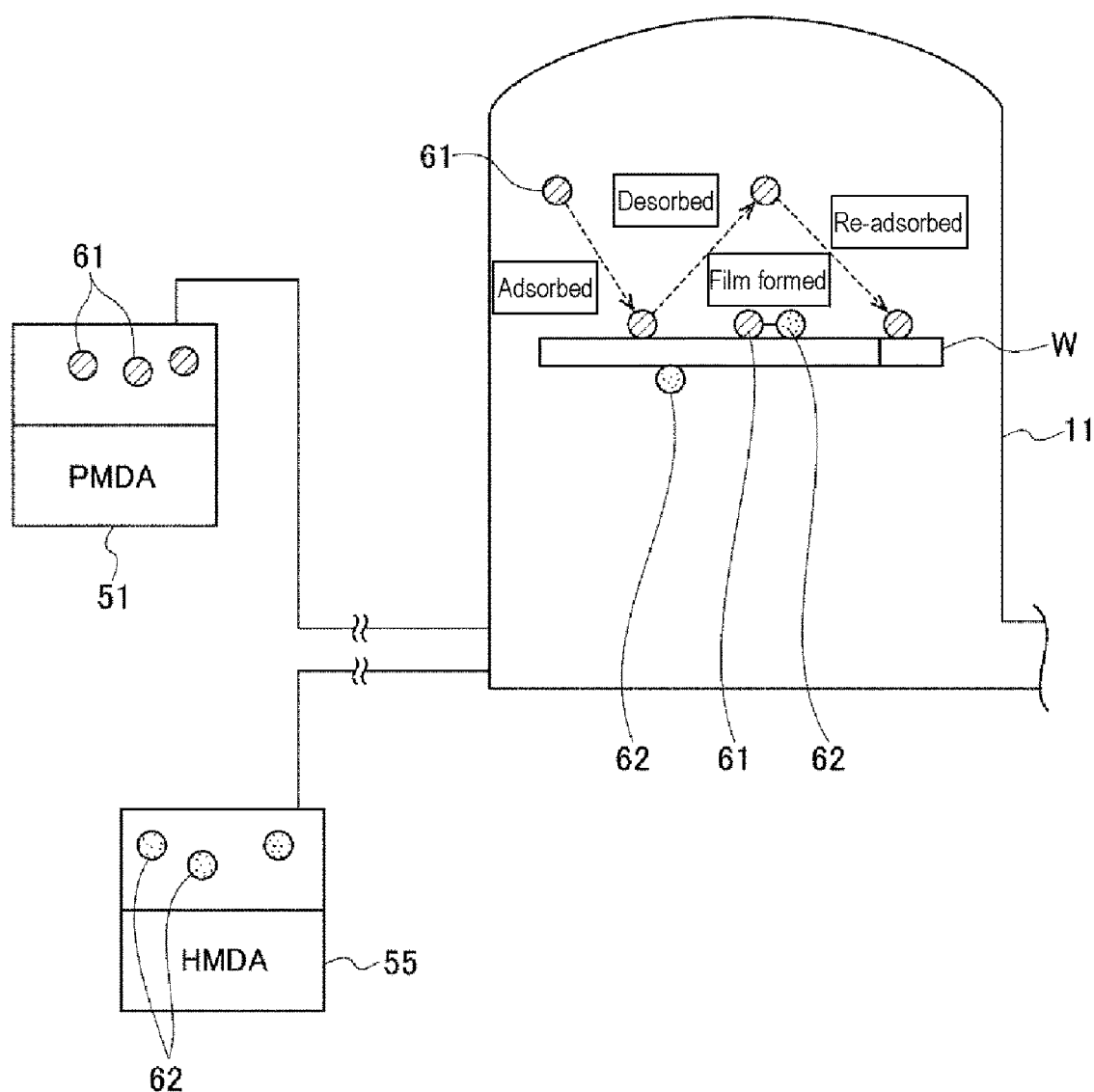
FIG. 4 is a schematic view showing a state of the film forming apparatus and the wafer.

Next, the reason why the front gas discharge holes 42 and the rear gas discharge holes 43 are formed in the gas injector 41 as described above will be described. FIG. 4 is a schematic view showing the inside of the reaction container 11 and the inside of the vaporization parts 51 and 55 during a film forming process. FIG. 4 shows a state in which a film forming process is performed by the above-described VDP in the reaction container 11. The PMDA monomer (denoted as 61) and the HMDA monomer (denoted as 62) vaporized in the vaporization parts 51 and 55, respectively, and supplied into the reaction container 11 as a film forming gas are repeatedly adsorbed and desorbed on the surface of each wafer W.

When one of the monomers 61 and 62 is adsorbed to the wafer W, the monomer makes polymerization reaction with the other monomer already adsorbed to the wafer W, thereby forming a structure (polymer) which is difficult to be separated from the wafer W. Thus, a polyimide film grows. In order to accelerate the adsorption of each of the monomers 61 and 62 to the wafer W and the polymerization thereof and to increase the film forming efficiency, the partial pressure of the film forming gas containing each of the monomers 61 and 62 in the reaction container can be made relatively high, namely so that the supply amount of each film forming gas is relatively large, and the temperature of the wafer W is relatively low.

Figure 5:
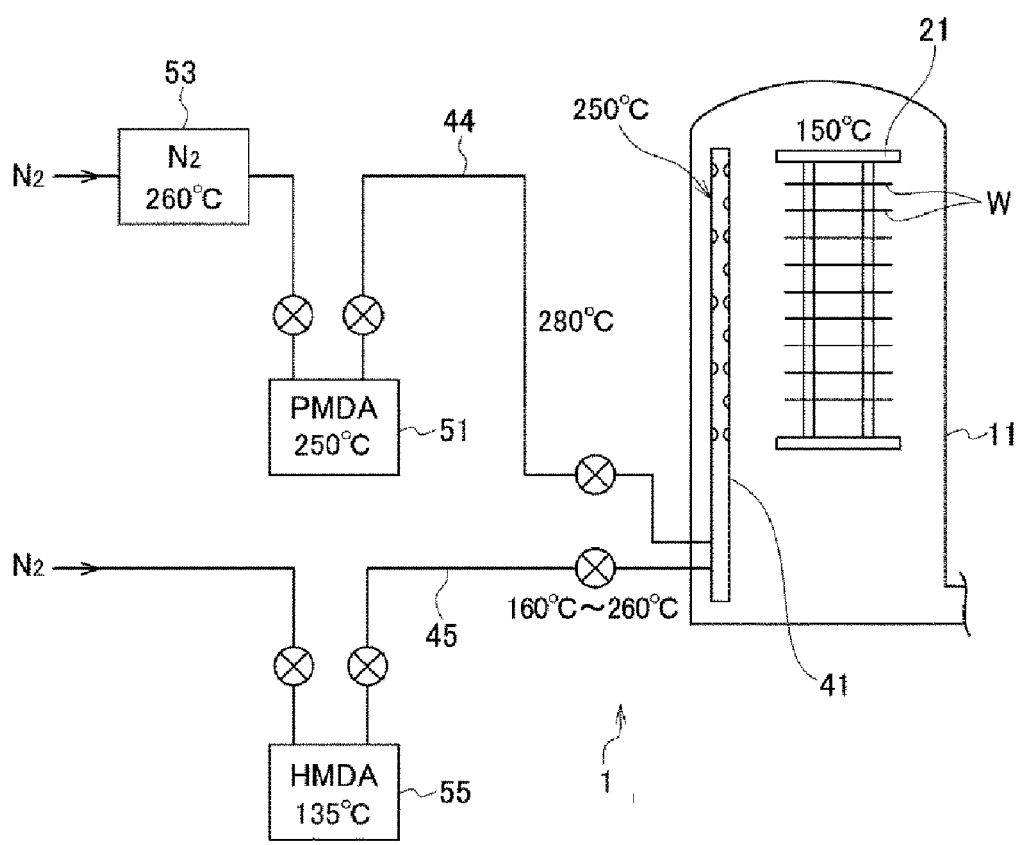
FIG. 5 is a schematic view showing temperatures of respective parts of the film forming apparatus.

The temperature inside the reaction container 11 is lowered in order to lower the temperature of the wafer W. However, the gas flow paths extending from the vaporization parts 51 and 55 to the gas injector 41 need to be heated to a temperature at which the monomers 61 and 62 are not condensed and solidified. FIG. 5 is a schematic view of the film forming apparatus 1 showing an example of the temperatures of the respective parts at which the adsorption of the monomers 61 and 62 to the wafer W can be accelerated and the condensation and solidification of the monomers 61 and 62 in the gas flow paths can be prevented. The temperature inside the reaction container 11 is 150 degrees C., the temperature inside the gas injector 41 is 250 degrees C., the temperature inside the gas introduction pipe 44 is 280 degrees C., the temperature inside the gas introduction pipe 45 is 160 degrees C. to 260 degrees C., the temperature inside the vaporization part 51 is 250 degrees C., and the temperature inside the vaporization part 55 is 135 degrees C. The gas heating part 53 heats the $N_2$ gas to 260 degrees C. In this way, the temperature of the gas flow path for the film forming gas containing PMDA, which extends from the inside of the vaporization part 51 to the inside of the gas injector 41, and the temperature of the gas flow path for the film forming gas containing HMDA, which extends from the inside of the vaporization part 55 to the inside of the gas injector 41, are controlled to become higher than the temperature inside the reaction container 11.

Figure 6:
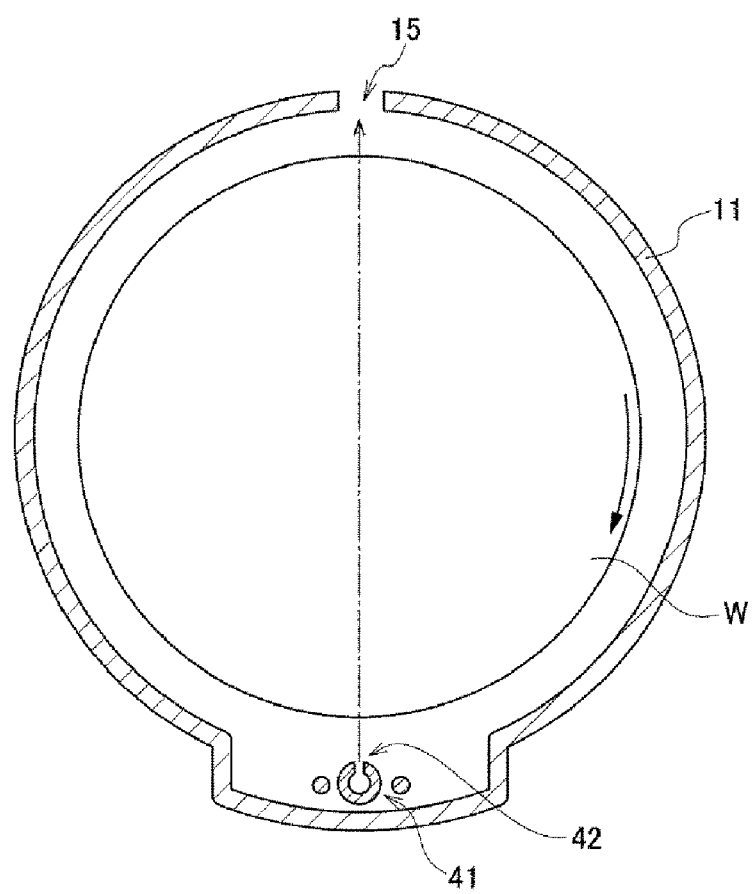
FIG. 6 is a horizontal sectional view of a reaction container showing a gas flow in the film forming apparatus.

In the state in which the temperatures of the respective parts are controlled as shown in FIG. 5, a film forming process is performed by discharging the film forming gas from only the front gas discharge holes 42 of the gas injector 41 not provided with the rear gas discharge holes 43, exhausting the film forming gas from the exhaust ports 15, and rotating the wafers W. In FIG. 6, the gas flow formed during the film forming process is indicated by a chain line arrow. Since the front gas discharge holes 42 are opened toward the wafers W, a large amount of film forming gas is discharged toward the front side. The film forming gas enters the spaces between the wafers W.

The film forming gas entering the spaces between the wafers W is moved toward the front exhaust ports 15 along the diameter of the wafers W while being heat-absorbed by the surfaces of the wafers W. Thus, the temperature of the film forming gas is gradually lowered, and the efficiency of adsorption of the monomers to the wafers W is increased. Accordingly, a relatively large amount of monomers is adsorbed in the region extending from the central portion of the wafer W to the peripheral edge portion of the front end along the diameter of the wafer W. However, the distance from the gas injector 41 to the rear end of the wafer W (the end of the wafer W on the side of the gas injector 41) is relatively short. Therefore, the film forming gas discharged at a high temperature reaches the rear end of the wafer W before it is sufficiently cooled. Thus, the adsorption efficiency of the monomers contained in the film forming gas is low in the peripheral edge portion of the rear end of the wafer W. In parallel with the adsorption of the monomers to the respective portions of the wafer W, the wafer W is rotated as indicated by a solid line arrow in FIG. 6. As a result, the film thickness in the central portion of the wafer W is larger than the film thickness in the peripheral edge portion of the wafer W.

Figure 7:
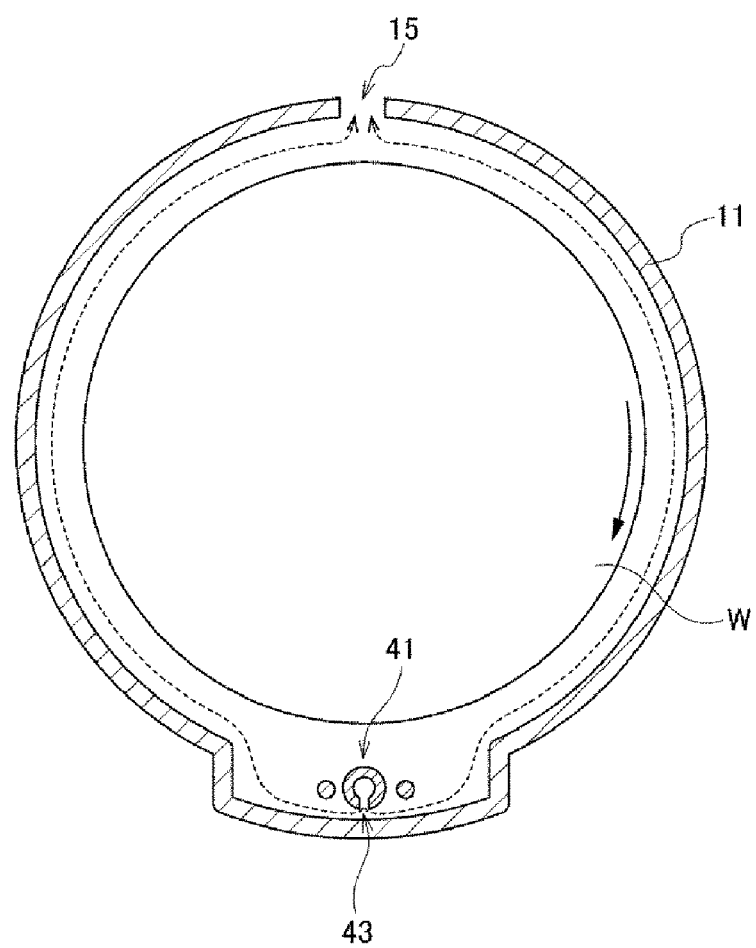
FIG. 7 is a horizontal sectional view of a reaction container showing a gas flow in the film forming apparatus.

Next, descriptions will be made on a case where, in the state in which the temperatures of the respective parts are controlled as shown in FIG. 5, a film forming process is performed by discharging the film forming gas from only the rear gas discharge holes 43 of the gas injector 41 not provided with the front gas discharge holes 42, exhausting the film forming gas from the exhaust ports 15, and rotating the wafers W. In FIG. 7, the gas flow formed during the film forming process is indicated by dot line arrows. Since the rear gas discharge holes 43 are opened toward the rear side wall of the inner tube 13, the discharged film forming gas collides with the side wall which is a gas temperature reducing member kept at a lower temperature than the film forming gas. The film forming gas flows along the side wall and is then supplied to the peripheral edge portion of the wafer W. By colliding with the side wall of the inner tube 13 and flowing along the side wall, the film forming gas is supplied to the peripheral edge portion of the wafer W in a state in which the film forming gas is heat-absorbed and cooled by the side wall. As a result, a relatively large amount of monomers is adsorbed by the peripheral edge portion of the wafer W. Even in the peripheral edge portion of the rear end of the wafer W in the vicinity of the gas injector 41, the film forming gas is cooled in this manner. Thus, a relatively large amount of monomers is adsorbed by the peripheral edge portion of the rear end of the wafer W.

However, the amount of the film forming gas supplied between the gas injector 41 and the rear end portion of the wafer W is relatively small because the rear gas discharge holes 43 are directed rearward. Therefore, it is difficult for the film forming gas to enter the narrow flow paths between wafers W. Accordingly, the adsorption efficiency of the monomers in the central portion of the wafer W is lower than the adsorption efficiency of the monomers in the peripheral edge portion of the wafer W. In parallel with the adsorption of the monomers to the respective portions of the wafer W, the wafer W is rotated as indicated by a solid line arrow. As a result, the film thickness in the peripheral edge portion of the wafer W becomes larger than the film thickness in the central portion of the wafer W.

As described above, the front gas discharge holes 42 and the rear gas discharge holes 43 act to create different film thickness distributions in the wafer W. Thus, in the film forming apparatus 1 described with reference to FIGS. 1 to 3, the film forming process is performed by discharging the film forming gas from both the front gas discharge holes 42 and the rear gas discharge holes 43 of the gas injector 41, whereby the difference in film thickness between the central portion and the peripheral edge portion of the wafer W is eliminated and the polyimide film having a highly uniform film thickness between the peripheral edge portion and the central portion of the wafer W is formed.

Figure 8:
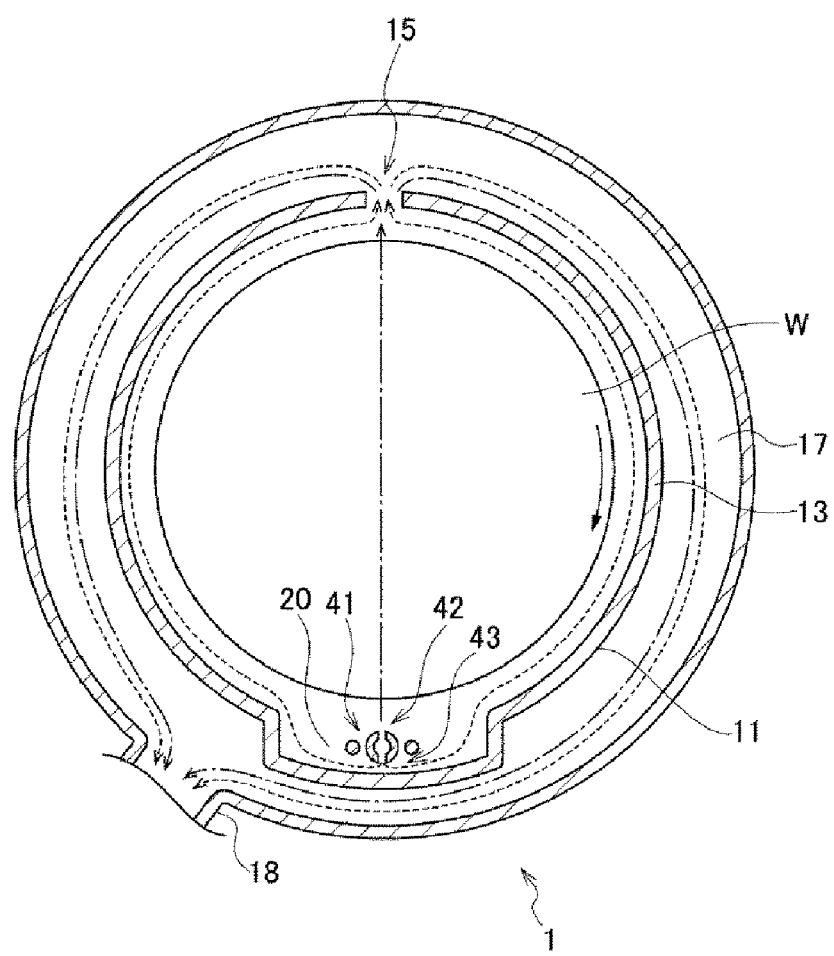
FIG. 8 is a horizontal sectional view of a reaction container showing a gas flow when a film forming gas is discharged from each gas discharge hole in the film forming apparatus.

Next, on the steps of the film forming process performed by the film forming apparatus 1 will be described in order. The respective parts of the film forming apparatus 1 are heated to the temperatures described with reference to FIG. 5. The wafer boat 21 on which a plurality of wafers W is mounted is loaded into the reaction container 11, and the inside of the reaction container 11 is hermetically closed by the lid 31. Subsequently, the inside of the reaction container 11 is evacuated so as to be a vacuum atmosphere of a predetermined pressure, and the wafer boat 21 is rotated. An $N_2$ gas is supplied from the gas introduction pipes 44 and 45 to the gas injector 41 and is discharged into the reaction container 11. Thereafter, the gas supplied to the gas injector 41 via the gas introduction pipe 44 is switched from the $N_2$ gas to the film forming gas containing PMDA. The film forming gas is discharged from the front gas discharge holes 42 and the rear gas discharge holes 43 into the inner tube 13. In FIG. 8, the film forming gas discharged from the front gas discharge holes 42 is indicated by a chain line arrow, and the film forming gas discharged from the rear gas discharge holes 43 is indicated by a dot line arrow.

As described with reference to FIG. 6, a relatively large amount of the film forming gas discharged from the front gas discharge holes 42 enters the spaces between the wafers W. As the film forming gas flows forward through the spaces between the wafers W, the film forming gas is heat-absorbed by the wafers W so that the temperature thereof is lowered. As a result, the PMDA monomer contained in the film forming gas is adsorbed in a relatively large amount to the region extending from the central portion of the wafer W to the peripheral edge portion of the front end of the wafer W. The film forming gas discharged from the rear gas discharge holes 43 is discharged to the diffusion region 20. The film forming gas collides with the rear side wall of the inner tube 13 as described with reference to FIG. 7 and flows forward along the side wall while being heat-absorbed by the side wall of the inner tube 13. Thus, the PMDA monomer contained in the film forming gas is adsorbed by the peripheral edge portion of the wafer W in a relatively large amount. During the rotation of the wafer W, the adsorption of the PMDA monomer occurs in the central portions and the peripheral edge portion of the wafer W, respectively, as described above. Therefore, the PMDA monomer is uniformly adsorbed by the entire wafer W. The film forming gas flowing forward inside the inner tube 13 and flowing toward the exhaust ports 15 flows into the exhaust pipe 18 via the ventilation region 17, whereby the film forming gas is removed.

Subsequently, the gas supplied to the gas injector 41 from the gas introduction pipe 44 is switched from the film forming gas containing PMDA to the $N_2$ gas. In other words, the $N_2$ gas is supplied from the gas introduction pipes 44 and 45 to the gas injector 41. The $N_2$ gas is discharged as a purge gas from the gas injector 41, whereby the film forming gas remaining in the reaction container 11 is purged. Thereafter, the gas supplied to the gas injector 41 from the gas introduction pipe 45 is switched from the $N_2$ gas to a film forming gas containing HMDA. Similar to the film forming gas containing PMDA, the film forming gas containing HMDA is discharged into the inner tube 13 from the front gas discharge holes 42 and the rear gas discharge holes 43 and is exhausted as shown in FIG. 8.

That is to say, the film forming gas discharged from the front gas discharge holes 42 is cooled while flowing through the spaces between the wafers W along the diameter of the wafers W. The monomer contained in the film forming gas is adsorbed in a relatively large amount to the region extending from the central portion of the wafer W to the peripheral edge portion of the front end thereof. The film forming gas discharged from the rear gas discharge holes 43 collides with the rear side wall of the inner tube 13. The film forming gas is cooled while flowing along the side wall. Thus, the monomer contained in the film forming gas is adsorbed by the peripheral edge portion of the wafer W in a relatively large amount. During the rotation of the wafer W, the adsorption of the HMDA monomer occurs in the central portion and the peripheral edge portion of the wafer W, respectively, as described above. The HMDA monomer is uniformly adsorbed by the entire wafer and is polymerized with the PMDA monomer to form a polyimide film.

Subsequently, the gas supplied to the gas injector 41 from the gas introduction pipe 45 is switched from the film forming gas containing HMDA to an $N_2$ gas. In other words, the $N_2$ gas is supplied to the gas injector 41 from the gas introduction pipes 44 and 45. The $N_2$ gas is discharged as a purge gas from the gas injector 41, whereby the film forming gas remaining in the reaction container 11 is purged. Thereafter, a cycle which includes the supply of the film forming gas including PMDA, the purging of the inside of the reaction container 11 by the $N_2$ gas, the supply of the film forming gas including HMDA, and the purging of the inside of the reaction container 11 by the $N_2$ gas is repeatedly performed a predetermined number of times. Thus, the polymerization reaction progresses and the film thickness of the polyimide film increases. When the cycle is performed the predetermined number of times and the polyimide film grows to have a desired film thickness, the rotation of the wafer boat 21 is stopped and the lid 31 is lowered to open the reaction container 11. The wafer boat 21 is unloaded from the reaction container 11 to complete the film forming process.

According to the above-described film forming apparatus 1, when the polyimide film is formed by supplying the film forming gas having a temperature higher than the temperature of the wafers W to the wafers W held on the wafer boat 21 so as to rotate about the vertical axis in the reaction container 11, the film forming gas is discharged from the gas injector 41 provided on the rear side of the inner tube 13 and is exhausted from the exhaust ports 15 opened on the front side of the inner tube 13. The rear gas discharge holes 43 of the gas injector 41 are opened rearward in the lateral direction so that the discharged film forming gas collides with the side wall of the inner tube 13 and is cooled before the film forming gas is supplied to the wafers W. The front gas discharge holes 42 of the gas injector 41 are opened forward in the lateral direction so that the discharged film forming gas does not collide with the side wall of the inner tube 13 before the film forming gas is supplied to the wafers W. With such a configuration, the adsorption amount of the monomers of the film forming gas can be controlled in the central portion and the peripheral edge portion of the wafer W, respectively. It is therefore possible to enhance the uniformity of the film thickness over the entire surface of the wafer W.

In the foregoing description, the film forming apparatus 1 is configured to make the film thickness uniform in the central portion of the wafer W and the peripheral edge portion of the wafer W. However, the film formation may be performed so that the film thickness in the central portion of the wafer W and the film thickness in the peripheral edge portion of the wafer W are different from each other. In other words, the film formation may be performed so that the regions having the same film thickness in the plane of the wafer W are distributed concentrically. That is to say, the above-mentioned film forming apparatus 1 is an apparatus for obtaining a desired film thickness by controlling the film thickness in the central portion of the wafer W and the film thickness in the peripheral edge portion of the wafer W, respectively.

Figure 9:
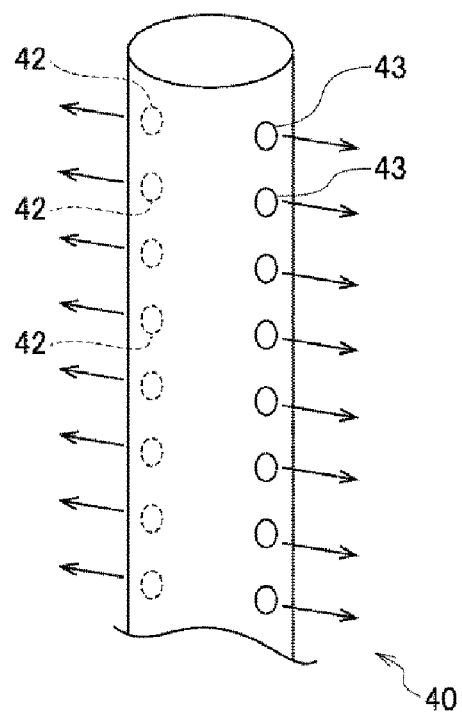
FIG. 9 is a perspective view showing another example of the gas injector.

The number and size of the front gas discharge holes 42 and the rear gas discharge holes 43 may be appropriately set so that the film thickness is a desired film thickness in the central portion and the peripheral edge portion. More specifically, the present disclosure is not limited to the number of the rear gas discharge holes 43/the number of the front gas discharge holes 42=1/2. The diameter of the front gas discharge holes 42 and the diameter of the rear gas discharge holes 43 may be different from each other. FIG. 9 shows a gas injector 40 that can be provided inside the inner tube 13 instead of the gas injector 41. The difference between the gas injector 40 and the gas injector 41 is that the number of front gas discharge holes 42 and the rear gas discharge holes 43 are equal. The front gas discharge holes 42 and the rear gas discharge holes 43 are also opened at the same height. Alternatively, the height of the front gas discharge holes 42 and the height of the rear gas discharge holes 43 may be different from each other.

Figure 10:
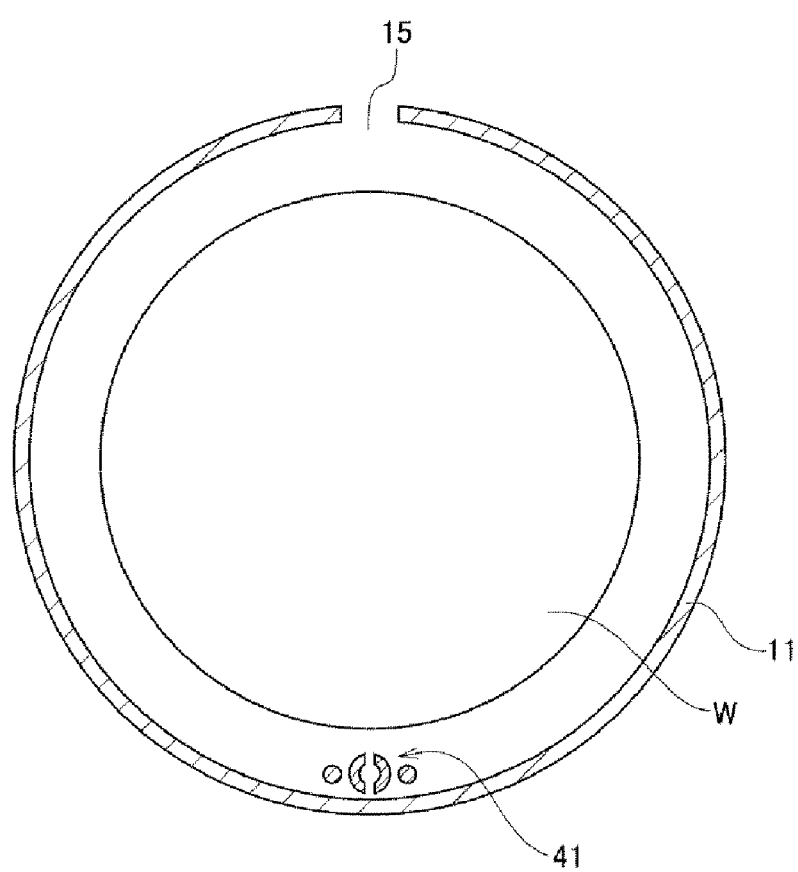
FIG. 10 is a horizontal sectional view showing a configuration example of another reaction container in the film forming apparatus.

As shown in the horizontal sectional view of FIG. 10, the inner tube 13 may not be provided with the diffusion region 20 formed by the convex portion 14, and the gas injector 41 may be disposed so as to be close to the wafer W. However, it is advantageous to provide the diffusion region 20 and to dispose the gas injector 41 in the diffusion region 20. By doing so, the distance over which the film forming gas discharged from the front gas discharge holes 42 flows to reach the wafer W is relatively long. As a result, the film forming gas is diffused in the vertical direction and is supplied uniformly to the wafers W. The film forming gas is sufficiently cooled until reaching the wafers W. This makes it possible to enhance the adsorption efficiency of the monomers in the wafers W.

Figure 11:
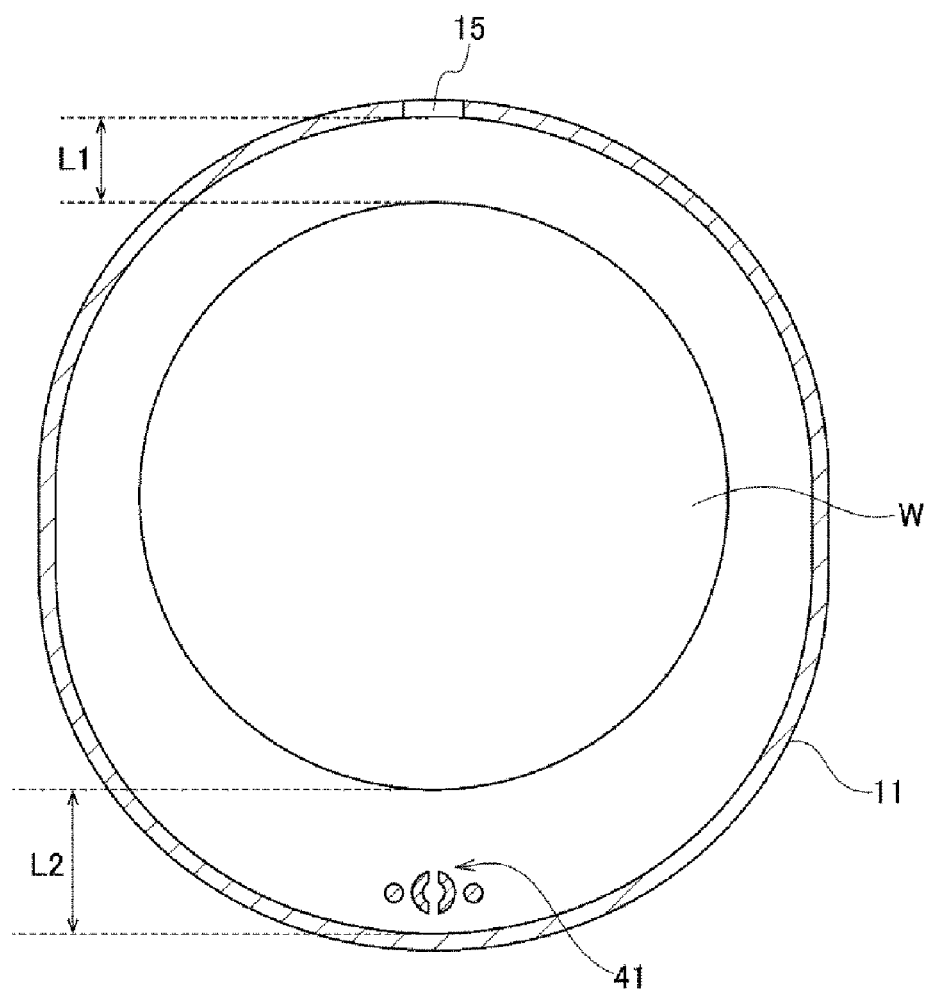
FIG. 11 is a horizontal sectional view showing a configuration example of another reaction container in the film forming apparatus.

In order to increase the distance over which the film forming gas discharged from the front gas discharge holes 42 flows to reach the wafers W, the present disclosure is not limited to forming the convex portion 14. In FIG. 11, when seen in a horizontal cross section, the rear end of the inner tube 13 extends rearward so as to form a part of an ellipse having a long axis extending in the front-rear direction. The distance L1 between the front end of the wafer W and the inner tube 13 is smaller than the distance L2 between the rear end of the wafer W and the inner tube 13. The gas injector 41 is disposed at a position closer to the side wall of the inner tube 13 than the wafer W.

Figure 12:
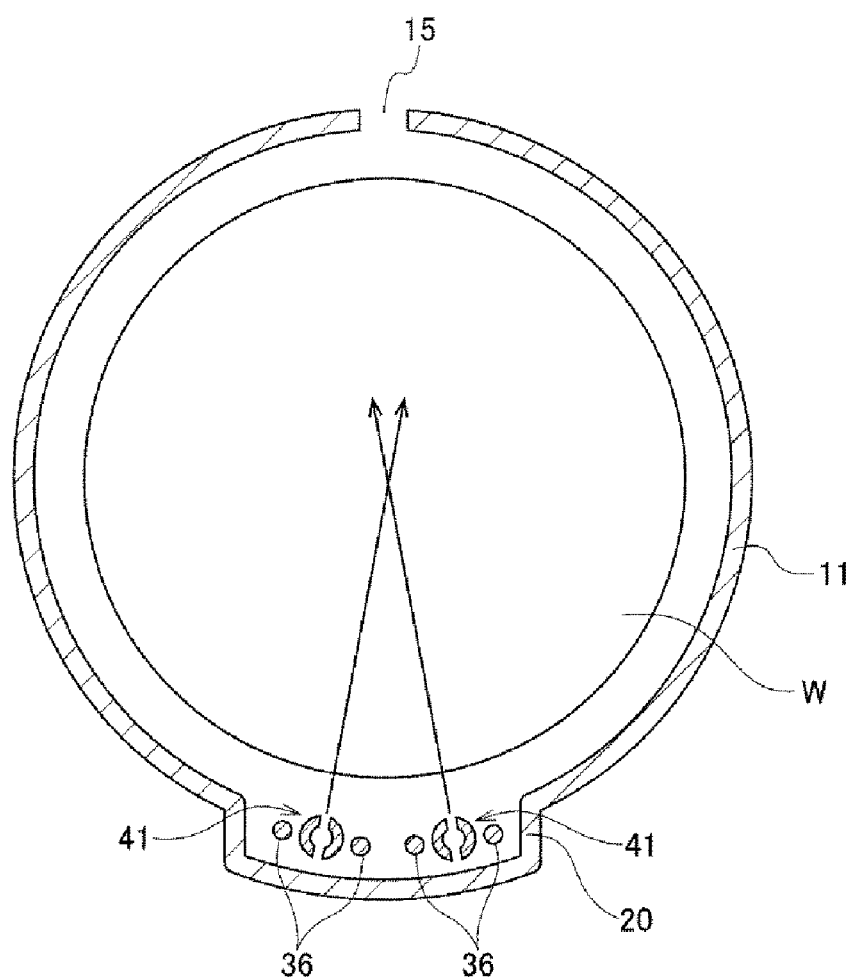
FIG. 12 is a horizontal sectional view of a reaction container showing another arrangement example of gas injectors.

In the above example, film formation is performed by alternately supplying different film forming gases to the gas injector 41. However, as shown in the horizontal sectional view of FIG. 12, two gas injectors 41 may be provided, and VDP may be performed on the wafer W by supplying one film forming gas from one gas injector 41 and supplying the other film forming gas from the other gas injector 41. In the example shown in FIG. 12, the respective gas injectors 41 are spaced apart from each other on the right and left sides of the diffusion region 20 and are disposed so that the front gas discharge holes 42 face the central portion of the wafer W. Arrows in FIG. 12 indicate the opening directions of the front gas discharge holes 42. In this example, nozzle heaters 36 are provided on the left and right sides of each gas injector 41.

In addition, when forming the polyimide film, the film forming gas is not limited to the film forming gas containing the above-mentioned monomers. For example, the film forming gas may contain 1,2,3,4-cyclobutane tetracarboxylic dianhydride (CBDA) or cyclopentane tetracarboxylic dianhydride (CPDA) instead of PMDA. The film forming gas may contain ODA ($C_{12}H_{12}N_2O$: 4,4'-diaminodiphenylether) or 4,4'-diaminodicyclohexylmethane (H12MDA) instead of HMDA. In addition, the film forming apparatus 1 is not limited to the formation of the polyimide film, and may be applied to, for example, a case where a polymer film such as a polyamide film, a polyamide imide film, a polyurea film, a polyurethane film, a polyazomethine film or the like is formed.

Figure 13:
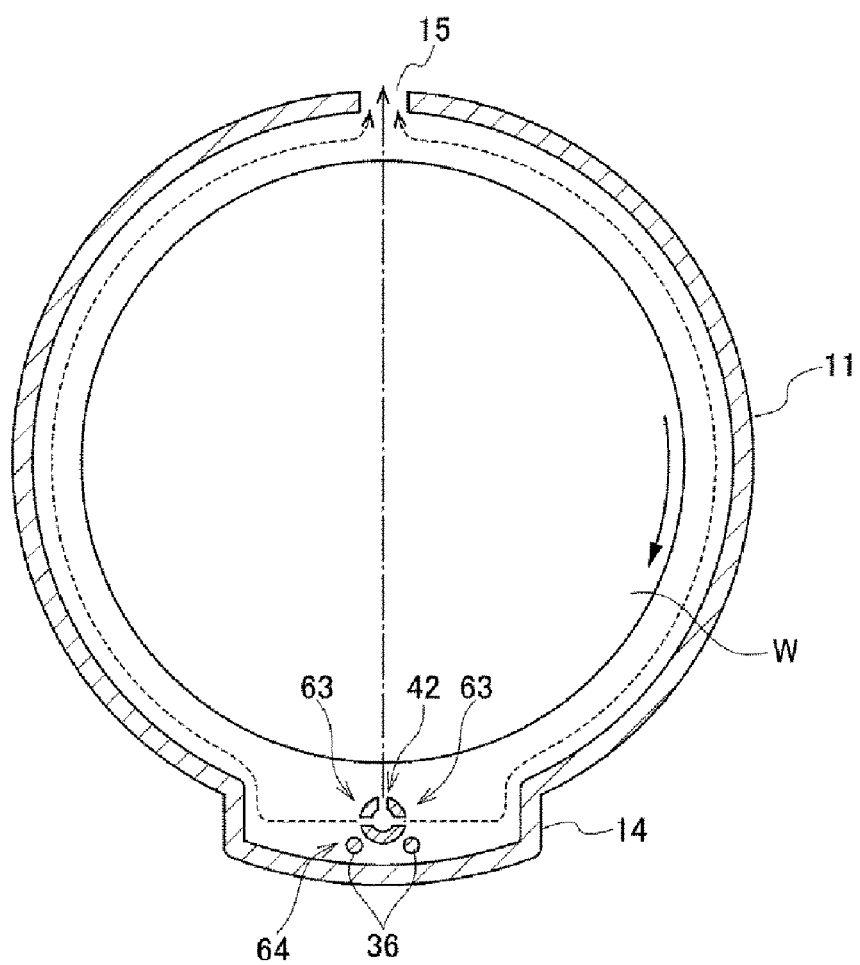
FIG. 13 is a horizontal sectional view of a reaction container showing another configuration example of a gas injector.

Incidentally, the opening direction of the gas discharge holes is not limited to the above example. In FIG. 13, there is shown a gas injector 64 having gas discharge holes 63 opened in the left and right directions instead of the rear gas discharge holes 43. The film forming gas discharged from the gas discharge holes 63 collides with the left and right side walls of the convex portion 14 as indicated by dot line arrows in FIG. 13 and is cooled. Thereafter, just like the film forming gas discharged from the rear gas discharge holes 43, the film forming gas discharged from the gas discharge holes 63 flows forward along the side wall of the inner tube 13. The film forming gas is further cooled and is moved toward the exhaust ports 15. The monomer in the film forming gas is adsorbed to the peripheral edge portion of the wafer W. The gas injector 64 has the same configuration as the gas injector 41, except that it can discharge the film forming gas to the left and right sides in this way.

Figure 14:
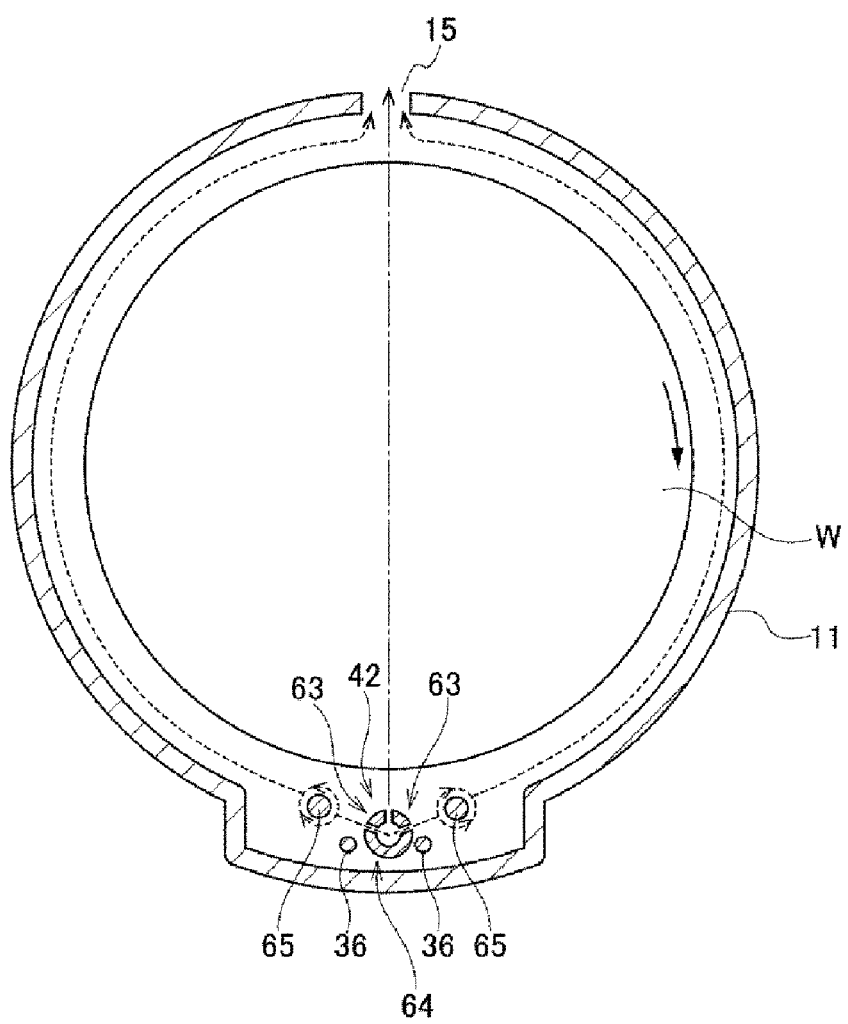
FIG. 14 is a horizontal sectional view of a reaction container showing a configuration example of a gas injector and a low temperature member.

In the example shown in FIG. 14, the gas discharge holes 63 of the gas injector 64 are opened toward the front left and right sides. Rod-shaped members 65 extending upward from the lid 31 are provided at positions on the rear side of the end portion of the wafer W in the opening direction of the gas discharge holes 63. By being provided inside the inner tube 13, the rod-shaped members 65 are also lower in temperature than the film forming gas discharged from the gas injector 64 just like the side surface of the inner tube 13. Accordingly, as indicated by dot line arrows in FIG. 14, the film forming gas discharged from the gas discharge holes 63 collides with the rod-shaped members 65. Thus, the film forming gas is cooled and then flows forward along the side wall of the inner tube 13 by the exhaust from the exhaust ports 15. The film forming gas is supplied to the peripheral edge portion of the wafer W. The monomer in the film forming gas is adsorbed to the peripheral edge portion of the wafer W. The temperature reducing member for reducing the temperature of the film forming gas by the collision of the film forming gas in this manner is not limited to being the side wall of the inner tube 13. The opening direction of the gas discharge holes facing the temperature reducing member is not limited to the rear side.

Further, it is only necessary that the film forming gas flows from the rear side to the front side of the wafer W. Therefore, the exhaust ports 15 are not limited to being provided at the same height as the formation region where the front gas discharge holes 42 and the rear gas discharge holes 43 of the gas injector 41 are formed as shown in FIG. 1. The exhaust ports 15 may be opened below the formation region, or may be opened above the formation region. It should be noted that the present disclosure is not limited to the above-described embodiments. The respective embodiments may be appropriately changed or combined.

[Evaluation Test]

Evaluation tests conducted in connection with the present disclosure will be described below.

Evaluation Test 1

Figure 2:
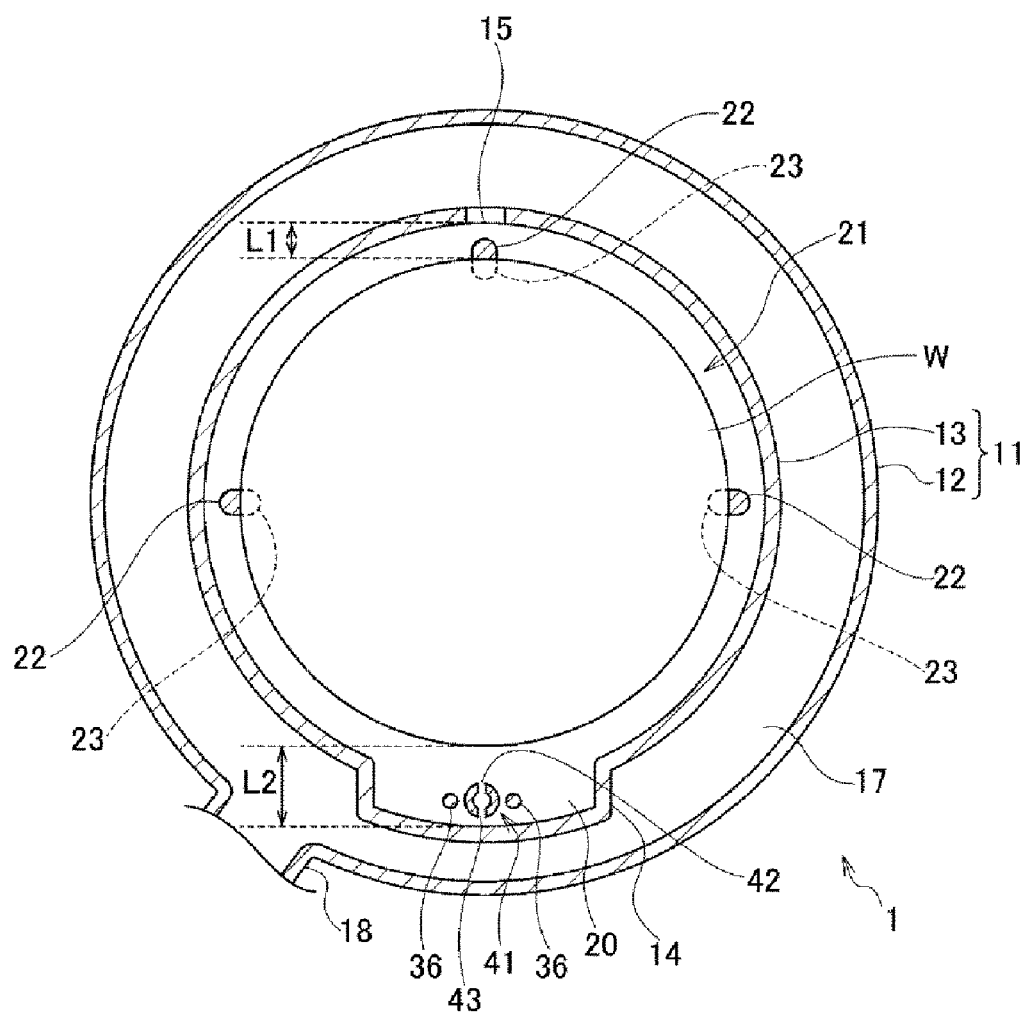
FIG. 2 is a horizontal sectional plan view of the film forming apparatus.
Figure 3:
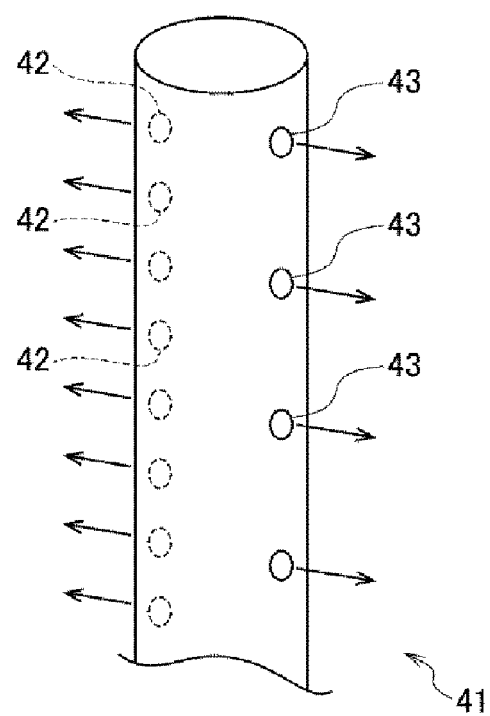
FIG. 3 is a perspective view of a gas injector provided in the film forming apparatus.

A film forming process was performed on the wafer W according to the procedure described in the embodiment of the present disclosure using the film forming apparatus having the same configuration as the film forming apparatus 1 shown in FIGS. 1 and 2 except that the rear gas discharge holes 43 were not provided. That is to say, the film forming process was performed according to the above procedure using the gas injector 41 shown in FIG. 6. However, during the discharge of the film forming gas, the wafer W was not rotated. This is referred to as evaluation test 1-1. On the other hand, a film forming process was performed under the same processing conditions as those of the film forming process of evaluation test 1-1 except that the wafer W is rotated during the discharge of the film forming gas. This is referred to as evaluation test 1-2. In evaluation tests 1-1 and 1-2, the film thickness distribution in the plane of the wafer W after the film forming process was investigated.

In the wafer W of evaluation test 1-1, the film thickness in the central portion and the front end portion was larger than the film thickness in other regions. In the wafer W of evaluation test 1-2, the film thickness in the central portion was larger than the film thickness in the peripheral edge portion. The reason for this result is that as described in FIG. 6, the temperature of the supplied film forming gas is different in the respective portions in the plane of the wafer W, as a result of which a difference occurs in the adsorption amount of the monomer.

Evaluation Test 2

A film forming process was performed on a wafer W according to the procedure described in the embodiment of the present disclosure using the film forming apparatus having the same configuration as the film forming apparatus 1 shown in FIGS. 1 and 2 except that the front gas discharge holes 42 were not provided. That is to say, the film forming process was performed according to the above procedure using the gas injector 41 shown in FIG. 7. However, during the discharge of the film forming gas, the wafer W was not rotated. This is referred to as evaluation test 2-1. On the other hand, a film forming process was performed under the same processing conditions as those of the film forming process of evaluation test 2-1 except that the wafer W is rotated during the discharge of the film forming gas. This is referred to as evaluation test 2-2. In evaluation tests 2-1 and 2-2, the film thickness distribution in the plane of the wafer W after the film forming process was investigated.

In the wafers W of evaluation tests 2-1 and 2-2, the film thickness in the peripheral edge portion was larger than the film thickness in the central portion. This is because as described in FIG. 7, the temperature of the supplied film forming gas is different in the respective portions in the plane of the wafer W, as a result of which a difference occurs in the adsorption amount of the monomer.

Evaluation Test 3

A film forming process was performed on a wafer W according to the procedure described in the embodiment of the present disclosure using the film forming apparatus 1 shown in FIGS. 1 and 2. However, as a gas injector, one of the gas injector 40 described with reference to FIG. 9 and the gas injector 41 described with reference to FIG. 3 was selected and used. The test in which the film forming process is performed using the gas injector 40 is referred to as evaluation test 3-1, and the test in which the film forming process is performed using the gas injector 41 is referred to as evaluation test 3-2. With respect to evaluation tests 3-1 and 3-2, the film thickness distribution in the plane of the wafer W after the film forming process was investigated.

In evaluation test 3-1, the film thickness in the peripheral edge portion of the wafer W was larger than the film thickness in the central portion of the wafer W. In evaluation test 3-2, the film thickness in the central portion of the wafer W was larger than the film thickness in the peripheral edge portion of the wafer W. Accordingly, it was confirmed from evaluation test 3 that, by adjusting the ratio between the number of the front gas discharge holes 42 and the number of the rear gas discharge holes 43, it is possible to change the ratio between the film thickness in the central portion of the wafer W and the film thickness in the peripheral edge portion of the wafer W.

Evaluation Test 4

Based on the result of evaluation test 3, by way of simulation, the number of the front gas discharge holes 42 and the number of the rear gas discharge holes 43 are adjusted so as to increase the uniformity of the film thickness in the plane of the wafer W. The film thickness distribution at the time of performing a film forming process on the wafer W was acquired. As a result, the difference between the maximum value and the minimum value of the film thickness in the plane of the wafer W was 1.2 nm. Since the difference between the maximum value and the minimum value of the film thickness is 2.0 nm in evaluation test 1-1, the difference between the maximum value and the minimum value of the film thickness is smaller in evaluation test 4 than in evaluation test 1. Accordingly, it was confirmed from evaluation test 4 that the uniformity of the film thickness in the plane of the wafer W can be increased by forming the front gas discharge holes 42 and the rear gas discharge holes 43.

According to the present disclosure, in the reaction container in which the substrates are accommodated so as to be held and rotated by the substrate holder, the film forming gas discharge part and the exhaust port are respectively provided on the rear side and the front side of the substrate holding region. The film forming gas discharge part includes the first gas discharge holes opened in the lateral direction so that the film forming gas before being supplied to the substrates collides with the gas temperature reducing member, and the second gas discharge holes opened toward the front side in a direction different from that of the first gas discharge holes so that the film forming gas before being supplied to the substrates does not collide with the gas temperature reducing member. With this configuration, it is possible to control the adsorption amount of the film forming gas in the central portion and the peripheral edge portion of the substrate, respectively, and to obtain a desired film thickness. As a result, it is possible to make the film thickness uniform in the central portion of the substrate and the peripheral edge portion of the substrate. Thus, the film formation can be performed so as to obtain a highly uniform film thickness over the entire surface of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a film by supplying a film forming gas to a plurality of substrates held in a shelf configuration by a substrate holder in a vertical reaction container in which a vacuum atmosphere is formed, comprising:
    a film forming gas discharge part provided on a rear side of a substrate holding region inside the reaction container and consisting of:
        a rod-shaped body extending along a vertical direction;
        a gas flow path formed inside the rod-shaped body along the vertical direction;
        first gas discharge holes formed in a side wall of the rod-shaped body and connected to the gas flow path, the first gas discharge holes being opened toward a side wall of the reaction container in a lateral direction such that the film forming gas discharged from the first gas discharge holes collides with the side wall of the reaction container before the film forming gas is supplied to the substrates; and
        second gas discharge holes formed in the side wall of the rod-shaped body and connected to the gas flow path, the second gas discharge holes being opened forward in a direction differing from an opening direction of the first gas discharge holes such that the film forming gas discharged from the second gas discharge holes does not collide with the side wall of the reaction container before the film forming gas is supplied to the substrates;
    an exhaust port provided on a front side of the substrate holding region and configured to exhaust the film forming gas;
    a rotation mechanism configured to rotate the substrate holder about a vertical axis;
    a heating part disposed outside of the reaction container and configured to heat the interior of the reaction container; and
    a controller configured to perform a control to heat the interior of the reaction container by the heating part to a temperature lower than a temperature of the film forming gas discharged from the film forming gas discharge part, such that the film forming gas, which is discharged from the first gas discharge holes and collides with the side wall of the reaction container, is cooled before the film forming gas is supplied to the substrates,
    wherein a sum of areas of the first gas discharge holes and a sum of areas of the second gas discharge holes are different from each other.

2. The apparatus of claim 1, wherein a distance between a rear end of each of the substrates in the substrate holding region and a side wall of the reaction container is larger than a distance between a front end of each of the substrates in the substrate holding region and the side wall of the reaction container.

3. The apparatus of claim 2, wherein a convex portion bulging outward is provided along the vertical direction on a rear side wall of the reaction container, and the film forming gas discharge part is provided in a film forming gas diffusion region defined inside the convex portion.

4. The apparatus of claim 1, wherein the first gas discharge holes are opened rearward.

5. The apparatus of claim 1, wherein the first gas discharge holes and the second gas discharge holes are respectively provided in the vertical direction.

6. The apparatus of claim 1, further comprising:
    a vaporization part configured to generate a first film forming gas by vaporizing a film forming raw material outside the reaction container; and
    an introduction path configured to introduce the first film forming gas into the film forming gas discharge part from the vaporization part,
    wherein when the first film forming gas is discharged from the film forming gas discharge part, a temperature of a flow path of the first film forming gas extending from the vaporization part to the film forming gas discharge part is set to a temperature higher than a temperature inside the reaction container.

7. The apparatus of claim 6, wherein the film forming gas discharge part is configured to discharge the first film forming gas containing a first monomer and a second film forming gas containing a second monomer from the first gas discharge holes and the second gas discharge holes, respectively, and the first monomer and the second monomer are film forming raw materials polymerized on a surface of each of the substrates to form a polymer film.

* * * * *